United States Patent [19]
Lee et al.

[11] Patent Number: 5,448,825
[45] Date of Patent: Sep. 12, 1995

[54] METHOD OF MAKING ELECTRICALLY AND THERMALLY ENHANCED INTEGRATED-CIRCUIT PACKAGE

[75] Inventors: Sang S. Lee, Sunnyvale; William M. Loh, Fremont, both of Calif.

[73] Assignee: VLSI Technology, Inc., San Jose, Calif.

[21] Appl. No.: 218,058

[22] Filed: Mar. 25, 1994

Related U.S. Application Data

[62] Division of Ser. No. 36,798, Mar. 25, 1993, Pat. No. 5,331,511.

[51] Int. Cl.6 .............................................. H01L 23/02
[52] U.S. Cl. ...................... 29/827; 174/52.2; 437/217
[58] Field of Search .............. 29/827; 174/52.2; 437/217

[56] References Cited

U.S. PATENT DOCUMENTS

| | | |
|---|---|---|
| 3,626,259 | 12/1971 | Garboushiam .................. 174/527 X |
| 4,513,355 | 4/1985 | Schroeder et al. |
| 4,542,259 | 9/1985 | Butt ................................. 437/217 X |
| 5,159,750 | 11/1992 | Dutta et al. |

Primary Examiner—Carl J. Arbes
Attorney, Agent, or Firm—Patrick T. King

[57] ABSTRACT

An encapsulated electrically and thermally enhanced integrated circuit is disclosed. An integrated-circuit die is attached to a thermally conductive, electrically-insulated substrate. A lead frame having inwardly-extending bonding fingers has the bottom sides thereof attached to the top of the substrate. A contiguous layer of insulating material is bonded to the top sides of the bonding fingers, such that the layer of insulating material peripherally surrounds the integrated-circuit die. A conductive layer of material is then bonded to the top of the insulating layer. A second layer of insulating material followed by a second conductive layer may be bonded on top of the first conductive layer. Electrical connections are made from the integrated-circuit die to the conductive layers surrounding the die. The device is then encapsulated in a plastic material.

10 Claims, 4 Drawing Sheets

METHOD OF MAKING ELECTRICALLY AND THERMALLY ENHANCED INTEGRATED-CIRCUIT PACKAGE

This is a divisional application of application Ser. No. 08/036,798, filed Mar. 25, 1993, now U.S. Pat. No. 5,331,511, issued Jul. 19, 1994.

BACKGROUND OF THE INVENTION

1. Field of the Invention

The present invention relates to integrated circuit manufacturing techniques and particularly to plastic encapsulation techniques for of electrically and thermally enhanced integrated-circuit package designs.

2. Prior Art

Conventional integrated circuit devices are commonly manufactured by attaching an integrated-circuit die to a lead frame. The lead frame includes a centrally located die-attach paddle, upon which the integrated-circuit die is mounted. The lead frame also includes a plurality of conductive leads, the inner ends of which converge at the die-attach paddle. Bonding finger portions at the inner ends of the leads are used to make electrical connections between the integrated-circuit die and the conductive leads of the lead frame. The entire assembly described above is encapsulated in a molded plastic material to form a molded-plastic body.

As semiconductor technologies improve, individual semiconductor circuit devices become smaller, allowing for greater die packing densities and increased operating speeds. However, these advancements present new problems as well. For example, as operating speeds increase, the inductance of the leads of the lead frame causes signal cross-talk and ground bounce. Additionally, as die densities increase, additional heat is produced by the die which can result in decreased operating performance or even failure of the integrated-circuit die.

As the operating speeds of the circuits on an integrated-circuit die increase, the inductance problems become more significant. Inductance can cause the VSS voltage on a ground bus to vary as various devices within the integrated circuit are switched on and off. Inductance in the leads of the integrated circuit and the lead frame can cause the VSS voltage to vary on the ground bus. This variation is referred to as ground bounce and degrades the high speed performance of the integrated circuit.

One technique for reducing inductance is to designate a number of leads or conductors which are connected in parallel. This increases the number of I/O package pins being required.

Another technique for reducing inductance is to use a multilayer printed-circuit substrate. This type of package is extremely expensive due to high manufacturing costs and low production yields for the printed circuit substrate.

A number of techniques have been used to alleviate the problems caused by heat buildup in a densely packed integrated-circuit die. One technique uses a thermally-conductive, electrically-insulated substrate to which the integrated-circuit die is attached. The bottom surface of the die is attached to the top surface of the thermally conductive substrate so that the thermally conductive substrate can transfer heat away from the integrated-circuit die. The thermally-conductive, electrically-insulated substrate is formed, for example, of a material such as alumina nitride. For good thermal operation, the thermally conductive substrates are relatively thick, significantly thicker than the die-attach paddle of a conventional lead frame.

However, because of this increased thickness and bulk of the substrate, the thicker thermally conductive substrates can impede or restrict the flow of the plastic molding compound to certain areas of the mold during encapsulation of the integrated circuit. The plastic molding material flows more freely over the top of the integrated circuit than under the integrated circuit. As a result of differences in flow rates, the air which is forced through the molds by the molding compound may be trapped on the bottom side of a package, which leaves blowholes or voids in the body of the molded package. Consequently, use of the thicker thermally conductive substrates has created moldability problems, such as formation of voids.

Consequently, the need exist for an integrated-circuit package configuration which has improved thermal performance, reduced inductance, and superior moldability characteristics.

SUMMARY OF THE INVENTION

It is therefore an object of this invention to provide an integrated circuit package which has improved thermal characteristics and reduced electrical inductance in a molded plastic package free of voids.

This object is achieved with an electrically and thermally enhanced integrated circuit which reduces inductance and ground noise problems, and which provides a balanced flow of plastic molding material around the integrated circuit. This is accomplished by peripherally surrounding an integrated-circuit die with one or more layers of conductive material separated from each other by layers of insulating material, and using the conductive layers as VSS ground and VDD power planes. During molding of a package body, the added conductive layer also serves as a barrier to provide for balanced flow of a molding compound around the integrated circuit.

An encapsulated, molded-plastic package for an electrically and thermally-enhanced, integrated circuit is provided. An integrated-circuit die is attached to the central area of the top surface of a thermally conductive, electrically-insulated substrate. A lead frame with inwardly-extending bonding fingers is also attached to the thermally conductive, electrically-insulated substrate. The bottom sides of the bonding fingers are attached to the top surface of the substrate such that the bonding fingers of the lead frame peripherally surround the integrated-circuit die.

A layer of insulating material is then bonded to the top side of the inwardly-extending bonding fingers, such that the bonding fingers are disposed between the layer of insulating material and the top of the thermally conductive, electrically-insulated substrate. The insulating layer is applied such that the insulating material peripherally surrounds or "rings" the integrated-circuit die. A layer of conductive material is then bonded directly on top of the insulating material, such that the layer of insulating material is disposed between the conductive layer and the bonding fingers. The conductive layer of material is also applied in a contiguous layer such that it peripherally surrounds or "rings" the integrated-circuit die. Electrical connections are then made from the integrated-circuit die to the conductive layer surrounding the die. After the electrical connections have been made, the entire device is encapsulated in a plastic material.

In one embodiment of the invention, additional alternating layers of insulating and conductive material are formed on top of the first layers of insulating and conductive material. In such arrangements, one of the conductive layers is used as a VDD power plane, and the other conductive layer is used as a VSS ground plane. In so doing, ground and power terminals on the integrated-circuit die can be attached directly to the ground or power conductive planes. Additionally, the alternating layers of insulating and conductive material provide resistance to the flow of the molding compound over the top of the integrated-circuit die. The restriction caused by the layers of material slows the flow of the molding material over the top of the die just as the thermally conductive substrate slows the flow of the molding compound under the integrated-circuit die. As a result, a balanced flow of the molding compound is achieved in the mold cavity and a plastic package free of blowholes or voids can be formed.

In another embodiment of the present invention, the thermally conductive, electrically insulated substrate is a copper slug which is separated from the integrated-circuit die and the bottom side of the bonding fingers of the lead frame by a layer of electrically insulating material. The copper slug is of a size such that when the entire assembly is encapsulated in plastic, the bottom portion of the slug remains exposed. That is, the bottom of the copper slug is not encapsulated in plastic, and thus the exposed copper surface allows for effective dissipation of heat away from the integrated-circuit die.

A method is also provided for producing an electrically and thermally enhanced integrated circuit. The method includes the steps of attaching an integrated-circuit die to a thermally-conductive, electrically insulated substrate, attaching bonding fingers of a lead frame to the top surface of the substrate, and bonding alternating layers of insulating and conductive material around the integrated-circuit die such that the layers of material peripherally or surround the integrated-circuit die. The layers of conductive material are then used as ground or power planes. Electrical ground and or power connections are then made from the integrated-circuit die to the conductive layers, and the integrated circuit is encapsulated in a plastic material.

BRIEF DESCRIPTION OF THE DRAWINGS

The accompanying drawings which are incorporated in and form a part of this specification, illustrate embodiments of the invention and, together with the description, serve to explain the principles of the invention.

DETAILED DESCRIPTION OF THE PREFERRED EMBODIMENTS

Figure 1:
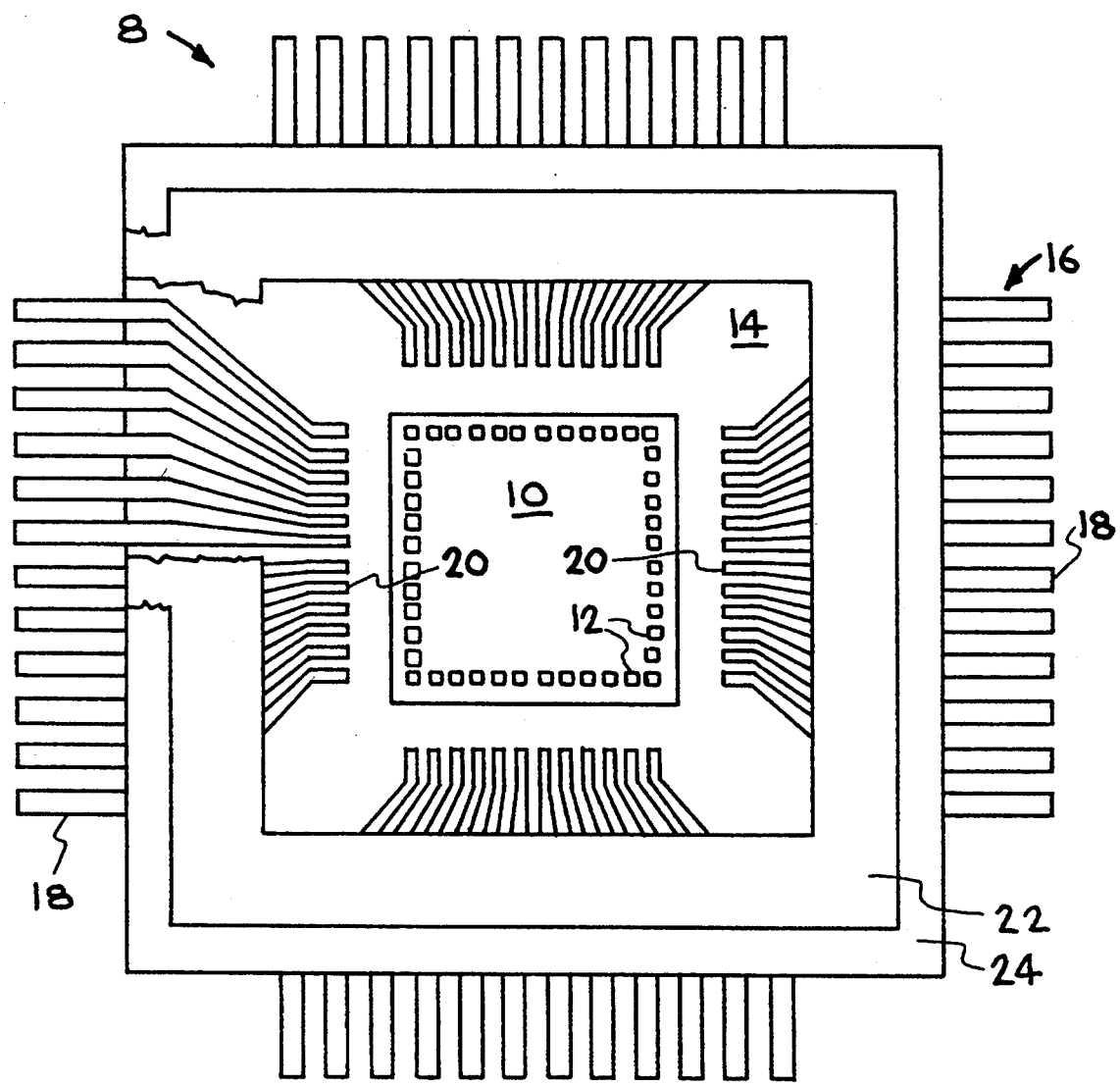
FIG. 1 is a partially cutaway plan view of an electrically and thermally enhanced integrated circuit package assembly, according to the present invention.
Figure 2:
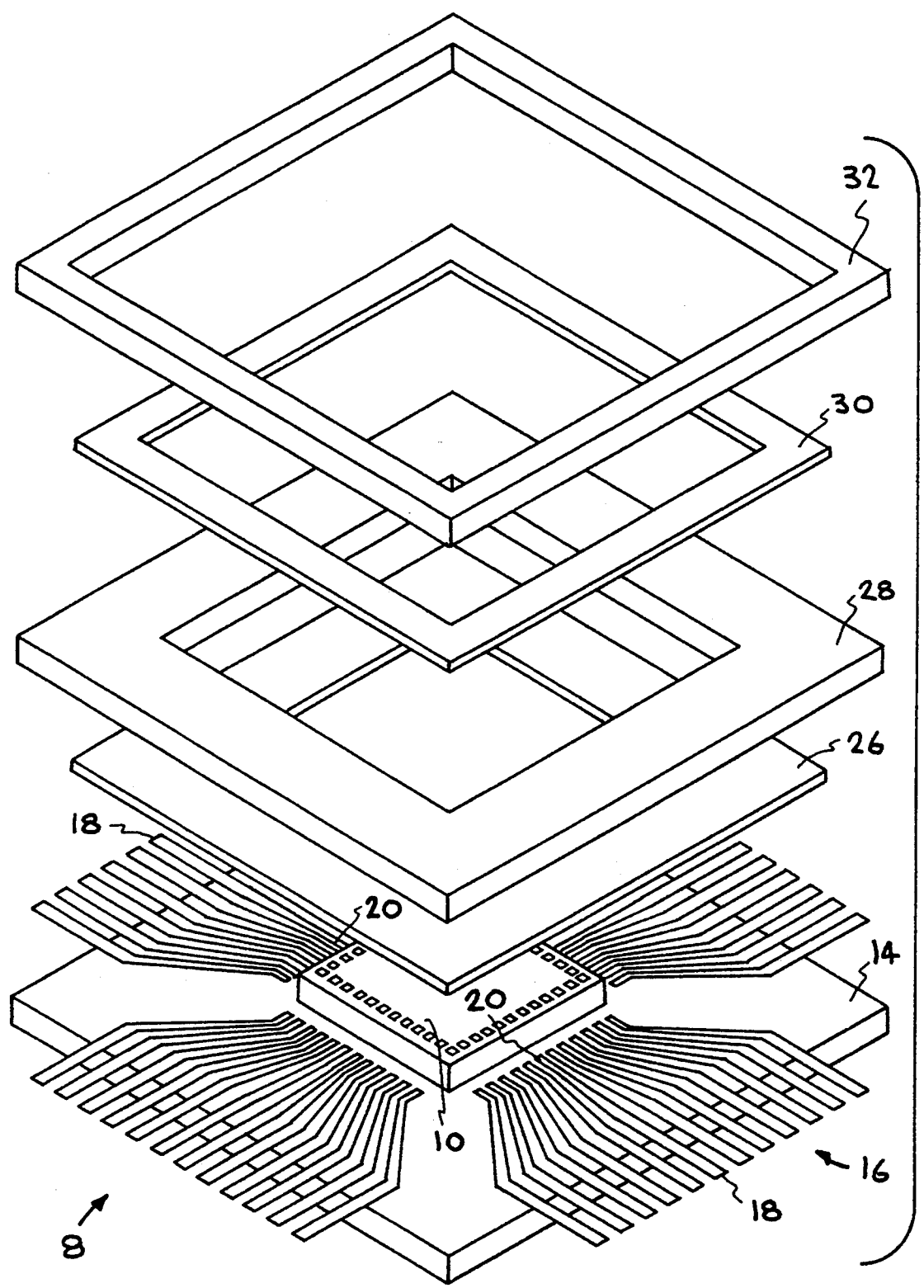
FIG. 2 is a perspective, exploded view of the assembly of FIG. 1.

Referring to FIG. 1 and FIG. 2 of the drawings, an intermediate package assembly 8 is shown according to the invention. FIG. 1 shows a plan view of the intermediate package assembly 8 according to the present invention. FIG. 2 shows the same assembly 8 in an exploded, perspective view. This assembly 8 is typically encapsulated into a final package assembly by molding a body formed of molded plastic material around this assembly 8.

The intermediate assembly 8 includes an integrated-circuit die 10 having wire-bonding pads (typically shown as 12) formed on the top surface thereof. The integrated-circuit die 10 is attached to the center area of a thermally conductive substrate 14. The thermally conductive substrate 14 can be formed from any one of many materials well known in the art, such as aluminum nitride or silicon carbide (SC) material. Alternatively, a slug of copper or similar conductive material, and a suitable insulator is used for the thermally-conductive, electrically-insulated substrate 14.

A lead frame 16 has a number of inwardly-extending leads 18 with the inner ends of the leads 18 forming bonding fingers 20. The bottom of the leads 18 and the bonding fingers 20 are attached to the top side of the thermally-conductive, electrically-insulating substrate 14. The lead fingers are attached to the substrate using a one mil thick film of R-Flex 1000 film material. The lead frame 16 with its inwardly-extending bonding fingers 20 at the inner ends of the leads 18 are typically formed of a metal such as copper or alloy 42. The bonding fingers 20 of the lead frame 16 extend around the outer margins of the top surface of the substrate 14, as illustrated.

A first insulating layer 26 is formed, for example, of one-mil R-Flex 1000 film material and is positioned over the leads 18 of the lead frame along the outer margins of the top surface of the thermally conductive, electrically-insulated substrate 14. The bottom surface of a first conductive layer 28 is positioned over and bonded to the insulating layer 26.

FIG. 1 illustrates that the first conductive layer 28 and the first insulating layer 26 are each formed as open rectangular window-frame members having widths which extend from the outer edges of the substrate 14 to near the bonding fingers 20.

A second insulating layer 30 is positioned over and is bonded to the top surface of the first conductive layer 28 along its outer margins. A second conductive layer 32 is positioned over and bonded to the second insulating layer 30. The second insulating layer 30 and the second conductive layer are also formed as open window-frame members with widths less than the widths of the first conductive layer 28 and the first insulating layer 26. This difference in widths exposes the top surface of the second conductive layer 32 and a substantial portion of the first conductive layer 28. A staircase structure is formed leaving a portion of the first conductive layer 28 and the second conductive layer 32 uncovered and available for electrical connections. The first and second layers 28, 32 of conductive material are formed of a material such as gold-plated copper or of other suitable conductive materials.

The assembly 8 is encapsulated in a molded package body formed of a plastic material, which is molded around the assembly 8 to form a final integrated-circuit package assembly.

Figure 3:
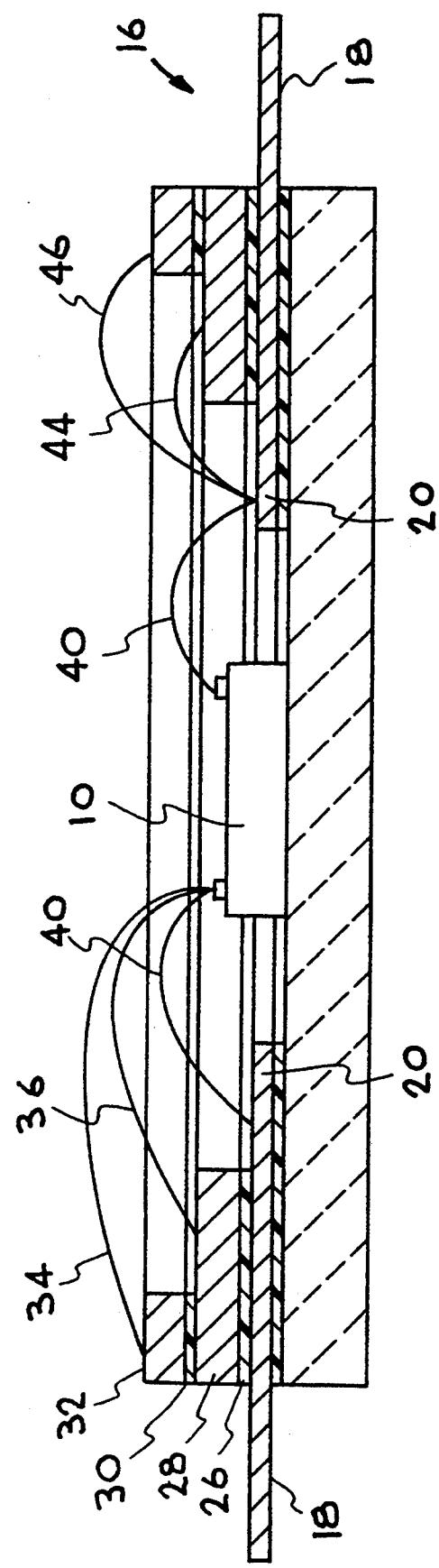
FIG. 3 is a sectional, elevation view of the assembly of FIG. 1, including electrical wire-bonds.

FIG. 3 shows a sectional, elevation view of the assembly of FIGS. 1 and 2. A number of bonding wires are illustrated as connecting the respective bonding pads on the integrated-circuit die 10 to various points on the package assembly. The first and the second conductive layers 28 and 32 are used as large-area, low-inductance conductive planes for appropriate supply voltages. The conductive layer 28 is used, for example, as a VSS ground plane and the conductive layer 32 is used as a VDD power plane.

The top surface of the integrated-circuit die 10 has a number of bonding pads formed thereon, some of those bonding pads are used for power and ground connections and some are used for signal input/output (I/O) connections. A typical bonding pad providing power to the die 10 is connected by a wire-bonded wire 34 directly to the VSS power plane 32. In a similar manner, a typical ground terminal on the die 10 is connected by a wire-bonded wire 36 directly to the ground plane 28. The large, low-inductance power-connection planes provided by the conductive layers 28, 32 can allow additional leads on the lead frame 16 to be available for other connections, such as I/O connections. Bonding wires 40 are connected between I/O signal bonding pads formed on the integrated-circuit die 10 and the bonding fingers 20 of the lead frame 16. The bonding fingers 20 are exposed on the surface of the substrate 14 between the die 10 and the first layer of insulating material 26. To provide external power and ground connections, additional bonding wires 44 and 46 are connected between the bonding fingers 20 and the respective ground and power planes 28, 32, as illustrated in the Figure.

As a result of using the first conductive layer 28 as a ground plane and of using the second conductive layer 32 as a power plane, the inductance for these connections to the integrated circuit die 10 can be reduced, reducing ground bounce and cross talk between neighboring leads. This approach provides a package having improved electrical performance with the low-cost of a molded plastic package.

Figure 4:
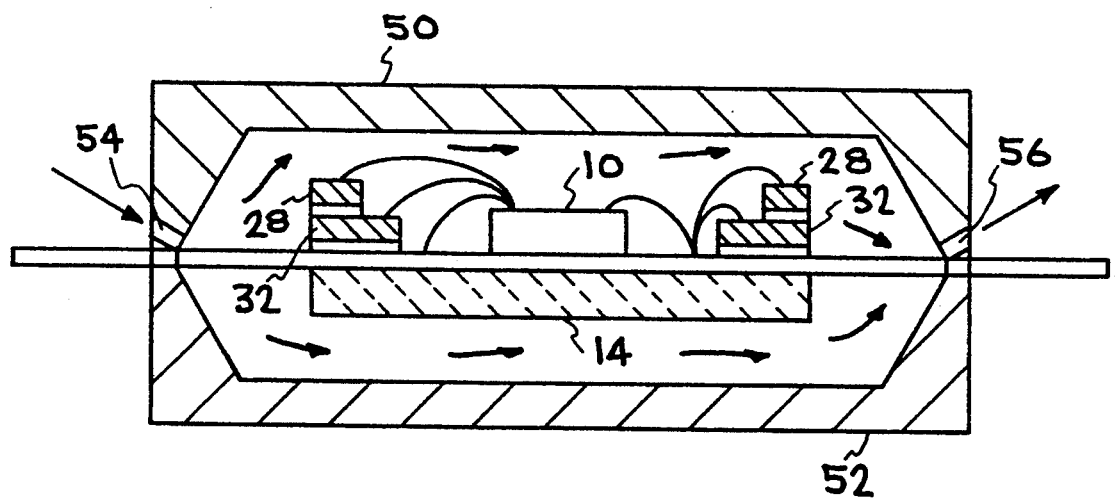
FIG. 4 is a sectional view of an upper mold half and a lower mold half containing a thermally conductive, electrically-insulated substrate assembly having conductive layers formed on the top side of the integrated-circuit die which balances the flow of plastic molding material in the upper and lower halves of the mold and tends to eliminate formation of voids in the molded plastic body of the package.

FIG. 4 illustrates an upper mold half 50 and a lower mold half 52 containing a thermally-enhanced, low inductance intermediate assembly, such as shown in FIG. 3. The assembly has the conductive layers 28, 32 of FIGS. 2 and 3 formed on the top side of the integrated-circuit die. The structure formed by these layers tends to modulate the flow of plastic molding material in the upper half of the mold. This balances the flow in the lower half of the mold. The result is to reduce formation of voids in the molded plastic body of the package, particularly in the lower half of the mold.

After all of the connections are made between the integrated circuit die 10, the bonding fingers 20, and the conductive planes 28 and 32 of FIGS. 2 and 3, the entire assembly is enclosed in a mold cavity formed between an upper mold half 50 and a lower mold half 52. The mold cavity is then filled with a plastic molding material which encapsulates the assembly in a molded plastic package body. The plastic molding material is, for example, a standard molding compound such as provided by the Sumitomo Company as 6300 HS or HG molding compound, or as 7320C low viscosity molding compound. The arrows show the flow of plastic molding material through the upper mold half 50 and through the lower mold half 52.

The plastic molding compound is injected into an inlet 54 in one side of the mold cavity. The molding material then flows both over and under the integrated-circuit die 10 and the substrate 14 towards the other side of the mold cavity where an air vent 56 allows the ambient air originally present in the mold cavity to escape. As described above, the conductive layers 28, 32 of FIGS. 2 and 3 tend to restrict the flow of the molding compound on the top side of the assembly such that the flow is balanced. Since there is a balanced flow of plastic material both over and under the integrated-circuit die assembly, the flows meet at the air vent 56 on the side of the mold cavity. This eliminates the formation of voids, or blowholes, in the molded body formed within the mold halves. Thus, the conductive layers not only provide for low-inductance power planes, but also assist, during the molding process, in reducing voids in the molded plastic body of the package. The conductive planes formed thereby can optionally be used for signals as well as for power connections, as required for particular applications. Additional conductive layers are formed in a manner similar to the first and second conductive layers, that is, by spacing additional insulating layers between adjacent conductive layers.

Figure 5:
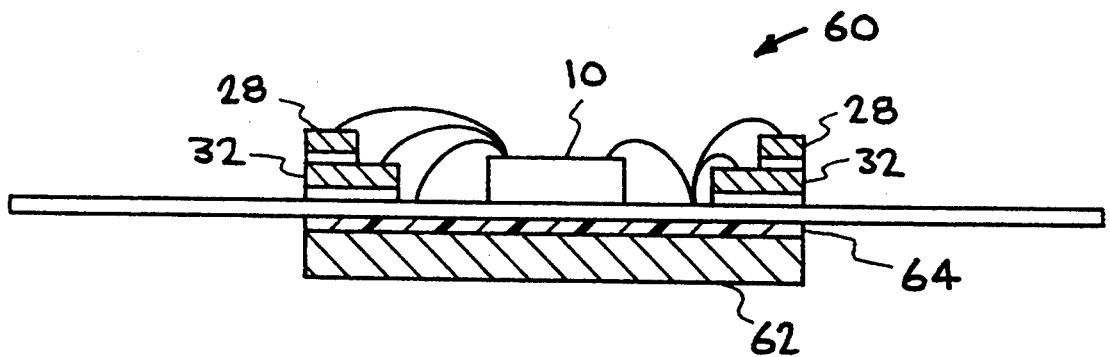
FIG. 5 is a sectional, elevation view of an alternative embodiment of an integrated-circuit assembly which uses an insulated copper slug to provide enhanced thermal characteristics.

FIG. 5 shows an alternative embodiment of an intermediate integrated-circuit assembly 60, which uses a conductive slug 62, made of copper or silicon carbide to provide enhanced thermal characteristics and low-inductance connections for an integrated-circuit die. An insulating layer 64 is provided, if necessary, to insulate the die 10 and the leads from the copper slug 62.

Note that while the invention has been described in connection with providing two conductive layers, a single conductive layer or three or more layers formed in accordance with the invention provide the advantages of the invention.

The foregoing descriptions of specific embodiments of the present invention have been presented for the purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A method of forming an electrically and thermally enhanced plastic encapsulated integrated-circuit comprising the steps of:

attaching an integrated-circuit die to the central region of the top surface of a thermally-conductive, electrically insulated substrate, attaching the bottom side of the inwardly-extending bonding fingers of a lead frame to the top surface of said thermally conductive, electrically-insulated substrate, such that said bonding fingers of said lead frame peripherally surround said integrated-circuit die, bonding a first contiguous layer of insulating material to the top side of said bonding fingers of said lead frame, such that said bonding fingers are disposed between said first contiguous layer of insulating material and said top surface of said thermally conductive, electrically-insulated substrate, and such that said first contiguous layer of insulating material peripherally surrounds said integrated-circuit die, bonding a first contiguous conductive layer on top of said first insulating layer such that said contiguous insulating layer is disposed between said contiguous conductive layer and said bonding fingers, electrically connecting said integrated-circuit die to said contiguous conductive layer, molding a plastic package body around said integrated-circuit die, said thermally conductive, electrically-insulated substrate, said contiguous insulating and conductive layers, and said inwardly extending bonding fingers.

2. The method as recited in claim 1 wherein the step of attaching an integrated-circuit die to the central region of the top surface of a thermally-conductive, electrically-insulated substrate includes attaching said integrated-circuit die to a thermally conductive, electrically-insulated substrate formed of alumina nitride material.

3. The method as recited in claim 1 wherein the step of attaching an integrated-circuit die to the central region of the top surface of a thermally-conductive, electrically-insulated substrate includes attaching said integrated-circuit die to a thermally conductive, electrically-insulated substrate formed of a copper slug separated from said integrated-circuit die and said bottom side of said bonding fingers by a layer of electrically insulating material.

4. The method as recited in claim 1 including the step of bonding a second contiguous layer of insulating material on top of said first contiguous conductive layer and bonding a second contiguous conductive layer on top of said second contiguous insulating layer so that said second contiguous insulating layer and said second contiguous conductive layer peripherally surround said integrated-circuit die.

5. The method as recited in claim 4 including the step of using said first and second contiguous conductive layers as ground and power planes for said integrated circuit die.

6. The method as recited in claim 4 including the step of providing said first contiguous insulating layer and said first contiguous conductive layer with a larger width than said second contiguous insulating layer and said second contiguous conductive layer, such that the edges of said second contiguous insulating layer and said second contiguous conductive layers are recessed from the edges of said first contiguous insulating layer and said first contiguous conductive layer.

7. The method as recited in claim 4 wherein the step of bonding a second contiguous layer of insulating material on top of said first contiguous conductive layer and bonding a second contiguous conductive layer on top of said second contiguous insulating layer so that both of said second contiguous layers peripherally surround said integrated-circuit die includes said first and second contiguous layers of insulating material being layers of polyimide.

8. The method as recited in claim 4 including the step of forming additional alternating contiguous layers of insulating and conductive material on top of said second contiguous conductive layer.

9. The method as recited in claim 4 wherein the step of molding a plastic package body includes restricting the flow of a plastic material over the top of said integrated-circuit die with said first and second contiguous conductive and insulating layers, such that a balanced flow of said plastic material is achieved both over and under said integrated-circuit die while molding said plastic package body around said integrated-circuit die.

10. A method of forming an electrically and thermally enhanced plastic encapsulated integrated-circuit comprising the steps of:

attaching an integrated-circuit die to the central region of the top surface of a thermally-conductive, electrically insulated substrate, attaching the bottom side of the inwardly-extending bonding fingers of a lead frame to the top surface of said thermally conductive, electrically-insulated substrate, such that said bonding fingers of said lead frame peripherally surround said integrated-circuit die, bonding a first contiguous layer of insulating material to the top side of said bonding fingers of said lead frame, such that said bonding fingers are disposed between said first contiguous layer of insulating material and said top surface of said thermally conductive, electrically-insulated substrate, and such that said first contiguous layer of insulating material peripherally surrounds said integrated-circuit die, bonding a first contiguous conductive layer on top of said first insulating layer such that said first contiguous insulating layer is disposed between said first contiguous conductive layer and said bonding fingers, bonding a second contiguous layer of insulating material on top of said first contiguous conductive layer and bonding a second contiguous conductive layer on top of said second contiguous insulating layer so that said second contiguous insulating layer and said second contiguous conductive layer peripherally surround said integrated-circuit die, electrically connecting said integrated-circuit die to said first contiguous conductive layer and said second contiguous conductive layer, molding a plastic package body around said integrated-circuit die, said thermally conductive, electrically-insulated substrate, said first and second contiguous insulating layers, said first and second contiguous conductive layers, and said inwardly extending bonding fingers wherein said step of molding a plastic package body includes restricting the flow of a plastic material over the top of said integrated-circuit die with said first and second contiguous conductive and insulating layers, such that a balanced flow of said plastic material is achieved both over and under said integrated-circuit die while molding said plastic package body around said integrated-circuit die.

* * * * *